United States Patent
Wills et al.

(10) Patent No.: US 7,130,749 B2
(45) Date of Patent: Oct. 31, 2006

(54) WAVELET ANALYSIS OF SIGNALS TO DETERMINE CHARACTERISTICS OF ANOMALIES IN A WIRE

(75) Inventors: Kendall S. Wills, Sugar Land, TX (US); Kartik Ramanujachar, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/749,885

(22) Filed: Dec. 31, 2003

(65) Prior Publication Data

US 2005/0021257 A1    Jan. 27, 2005

Related U.S. Application Data

(60) Provisional application No. 60/486,663, filed on Jul. 11, 2003.

(51) Int. Cl.
*G01R 31/00*    (2006.01)

(52) U.S. Cl. ......................................... 702/58

(58) Field of Classification Search .................. 702/17, 702/35, 39, 57–59, 66, 71, 159, 189; 73/659; 367/38, 131, 104; 324/637, 639, 642
See application file for complete search history.

(56) References Cited

U.S. PATENT DOCUMENTS 4,924,449 A * 5/1990 Guigne ........................ 367/104

(Continued)

OTHER PUBLICATIONS

Michael Dockins, Texas Instruments, Inc., "Frequency Domain Analysis of Time Domain Reflectometry Signals," Aug. 9, 2002, 43 pages, Aug. 2, 2002.

(Continued)

*Primary Examiner*—Bryan Bui
*Assistant Examiner*—Aditya Bhat
(74) *Attorney, Agent, or Firm*—Yingsheng Tung; Wade James Brady, III; Frederick J. Telecky, Jr.

(57) ABSTRACT

In one embodiment, a method for wavelet analysis of one or more signals to determine one or more characteristics of one or more anomalies in a wire includes receiving a first signal from a detector that has scanned a magnetic field from a wire including an anomaly. The first signal corresponds to a second signal used to generate the magnetic field. The method includes calculating a wavelet analysis result from a wavelet analysis of the first signal. The wavelet analysis result corresponds to the second signal. The method includes accessing a library of one or more reference wavelet analysis results that each correspond to one or more known anomalies having one or more known characteristics and comparing the wavelet analysis result with one or more reference wavelet analysis results. If the wavelet analysis result corresponds to one or more particular reference wavelet analysis results, it is indicated that the anomaly in the wire has one or more particular known characteristics of one or more particular known anomalies corresponding to the one or more particular reference wavelet analysis results. If the wavelet analysis result of the TDR signal does not correspond to one or more reference wavelet analysis results, it is indicated that the anomaly in the wire lacks one or more known characteristics of one or more known anomalies corresponding to one or more reference wavelet analysis results in the library.

15 Claims, 1 Drawing Sheet

U.S. PATENT DOCUMENTS

| | | | | |
|---|---|---|---|---|
| 5,243,565 A | * | 9/1993 | Yamamoto | 367/131 |
| 5,740,036 A | * | 4/1998 | Ahuja et al. | 702/17 |
| 6,311,130 B1 | * | 10/2001 | Huang | 702/2 |
| 6,539,319 B1 | * | 3/2003 | Grichnik | 702/75 |
| 6,542,836 B1 | * | 4/2003 | Sasaki et al. | 702/66 |
| 6,751,564 B1 | * | 6/2004 | Dunthorn | 702/66 |
| 6,754,601 B1 | * | 6/2004 | Eryurek et al. | 702/104 |
| 2004/0230383 A1 | * | 11/2004 | Bechhoefer et al. | 702/57 |
| 2005/0021256 A1 | * | 1/2005 | Wills et al. | 702/66 |
| 2005/0021257 A1 | * | 1/2005 | Wills et al. | 702/66 |

OTHER PUBLICATIONS

Michael Dockins, "Affidavit of Michael D. Dockins," signed Jan. 15, 2004, 2 pages.

Dr. Krzysztof Michalski "Affidavit of Dr. Krzysztof Michalski," signed Jan. 15, 2004, 2 pages.

* cited by examiner

WAVELET ANALYSIS OF SIGNALS TO DETERMINE CHARACTERISTICS OF ANOMALIES IN A WIRE

RELATED APPLICATION

This Application claims the benefit, under 35 U.S.C. § 119(e), of U.S. Provisional Application No. 60/486,663, filed Jul. 11, 2003.

TECHNICAL FIELD OF THE INVENTION

This invention relates generally to signal analysis and more particularly to wavelet analysis of signals to determine characteristics of anomalies in a wire.

BACKGROUND

A superconducting quantum interference detector (SQUID) or other suitable detector can be used to detect a magnetic field from a wire in a die or integrated circuit (IC) package to relatively imprecisely determine a location of the wire and a location of an anomaly in the wire.

SUMMARY OF THE INVENTION

According to the present invention, disadvantages and problems associated with analyzing one or more signals may be reduced or eliminated.

In one embodiment, a method for wavelet analysis of one or more signals to determine one or more characteristics of one or more anomalies in a wire includes receiving a first signal from a detector that has scanned a magnetic field from a wire including an anomaly. The first signal corresponds to a second signal used to generate the magnetic field. The method includes calculating a wavelet analysis result from a wavelet analysis of the first signal. The wavelet analysis result corresponds to the second signal. The method includes accessing a library of one or more reference wavelet analysis results that each correspond to one or more known anomalies having one or more known characteristics and comparing the wavelet analysis result with one or more reference wavelet analysis results. If the wavelet analysis result corresponds to one or more particular reference wavelet analysis results, it is indicated that the anomaly in the wire has one or more particular known characteristics of one or more particular known anomalies corresponding to the one or more particular reference wavelet analysis results. If the wavelet analysis result of the TDR signal does not correspond to one or more reference wavelet analysis results, it is indicated that the anomaly in the wire lacks one or more known characteristics of one or more known anomalies corresponding to one or more reference wavelet analysis results in the library.

Particular embodiments of the present invention may provide one or more technical advantages. Particular embodiments may facilitate analysis of frequency content of one or more signals corresponding to one or more magnetic fields from a wire. Particular embodiments may be used to more accurately determine one or more characteristics of one or more anomalies in a wire. Particular embodiments may be used to more precisely determine one or more locations of one or more anomalies in a wire. Certain embodiments may provide all, some, or none of these technical advantages. Certain embodiments may provide one or more other technical advantages, one or more of which may be readily apparent to those skilled in the art from the figures, descriptions, and claims herein.

BRIEF DESCRIPTION OF THE DRAWINGS

To provide a more complete understanding of the present invention and the features and advantages thereof, reference is made to the following description, taken in conjunction with the accompanying drawings, in which.

DESCRIPTION OF EXAMPLE EMBODIMENTS

Figure 1:
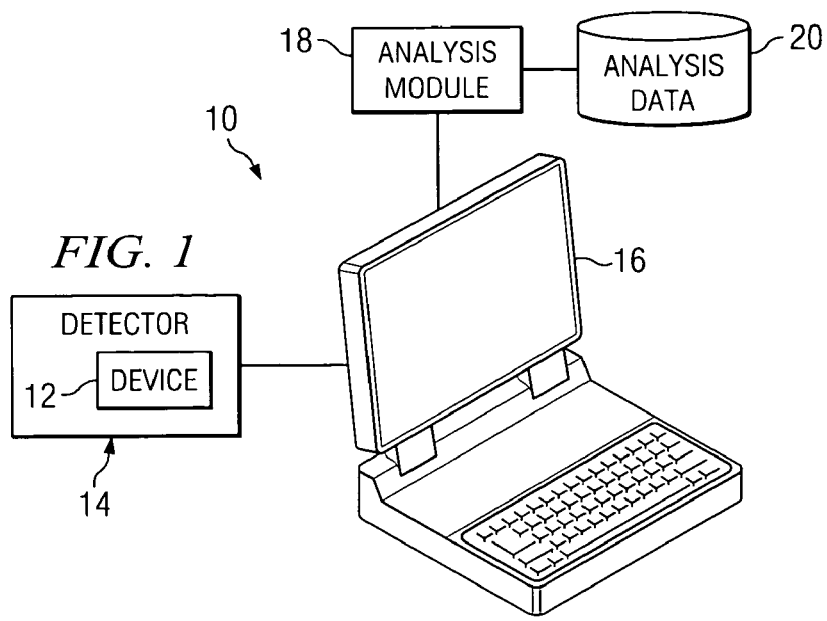
FIG. 1 illustrates an example system for wavelet analysis of one or more signals to determine one or more characteristics of one or more anomalies in a wire.

FIG. 1 illustrates an example system 10 for wavelet analysis of one or more signals to determine one or more characteristics of one or more anomalies in a wire. System 10 includes a device 12, a detector 14, a computer system 16, an analysis module 18, and analysis data 20. Device 12 is any suitable device including one or more wires (which may each include one or more conductive links coupling two or more components of device 12 to each other) for testing. As an example, in particular embodiments, device 12 is an integrated circuit (IC) package including one or more wires coupling input and output pins to solder bumps for electrically coupling the IC package to a die. As another example, in particular embodiments, device 12 is a die including one or more wires linking a land of the die (which may be coupled to a solder bump of an IC package) to one or more components of an IC in the die. Although particular devices 12 including particular wires are described, the present invention contemplates any suitable device 12 including any suitable wires.

Analysis module 18 may be a component of computer system 16 or a device separate from computer system 16. Analysis module 18 may include software, hardware, or both for analyzing one or more signals from detector 14. As an example, in particular embodiments, analysis module 18 may include NEOCERA software for analyzing one or more signals from detector 14 or MATLAB or other suitable mathematical analysis tool. Analysis data 20 may include data that may be used to analyze one or more signals, as described below. Detector 14 may include a SQUID, magnetoresistive detector, magnetic tunneling junction, or other detector for detecting a magnetic field from a wire and generating one or more signals corresponding to the magnetic field. A signal may be communicated down the wire to generate the magnetic field. In particular embodiments, the signal is a time domain reflectometry (TDR) signal. In particuar embodiments, the signal is a high-frequency pulse. In particular embodiments, a frequency of the signal is selected to enable the signal to substantially maximize power down the wire and substantially minimize reflection back up the wire, which may facilitate propagation of the signal through the wire. "Signal" may encompass one or more signals communicated down a wire, one or more signals reflected back up the wire, or both, where appropriate.

In particular embodiments, one or more signals are communicated down the wire and detector 14 scans device 12 to detect a resulting magnetic field from the wire. Detection of the magnetic field from the wire may indicate the location of the wire with respect to device 12. Detector 14 measures the magnetic field along the wire to determine changes in the magnetic field along the wire. Measuring the magnetic field along the wire may include determining a direction and a magnitude of the magnetic field at multiple location along the wire. An anomaly in the wire (which may include a break, open, short, or other anomaly) may cause a change in the magnetic field at the anomaly, and detector 14 may detect the change in the magnetic field cause by the anomaly. "Magnetic field" may encompass a magnetic field, one or more changes in the magnetic field, or both, where appropriate. Detector 14 may record the magnetic field and (automatically or in response to input from computer system 16 or a user) communicate one or more signals corresponding to the magnetic field to computer system 16 for analysis. Because the magnetic field may correspond to the signal that generated the magnetic field from the wire, the one or more signals from detector 14 may also correspond to the signal that generated the magnetic field in the wire. Analysis of the one or more signals from detector 14 may therefore correspond to analysis of the signal that generated the magnetic field. "Signal" may encompass a signal used to generate a magnetic field, a signal from detector 14, or both, where appropriate.

Computer system 16 and analysis module 18 may then analyze the signals from detector 14. In particular embodiments, computer system 18 may analyze the signals automatically or in response to input from a user. In particular embodiments, the signals may be analyzed to determine whether the wire includes one or more anomalies. In particular embodiments, if the wire includes an anomaly, the signals may be analyzed to determine one or more characteristics of the anomaly. A characteristic of an anomaly may include a location of the anomaly, a nature of the anomaly, a shape of the anomaly, contents of the anomaly (if any), or other characteristic. The anomaly may affect the magnetic field from the wire at the anomaly. As an example, consider a break in a wire. Propagation of a signal through the break (which may include propagation of the signal through a dielectric, air, or other material in the break) may affect a magnetic field resulting from wire. In addition or as an alternative, reflection of the signal off the break may affect the magnetic field. Frequency content of one or more signals from detector 14 may contain at least some information indicating one or more effects of the anomaly on the magnetic field.

While a Fourier Transform (FT) may be used to analyze frequency content of the signals, one or more disadvantages may be associated with FTs. A drawback of FTs is that, in an FT analysis of a function, the function is assumed to be periodic and to extend infinitely in a time domain. In contrast, a signal used to generate a magnetic field for analysis of a wire is typically a critically damped pulsed signal that, in a time domain, has a rapidly rising leading edge. As a result, an FT cannot accurately represent a signal used to generate a magnetic field for analysis of a wire. In addition, an FT of a signal assumes that sinusoidal basis functions are alone adequate to reconstruct the signal, which is often not the case. In contrast, in particular embodiments, wavelet analysis is used to analyze frequency content of a signal. Wavelet analysis allows one or more basis functions for reconstructing the signal to be selected according to one or more particular characteristics (such as one or more time characteristics, shape characteristics, or both) of the signal. Unlike FTs, wavelet transforms are not limited to sinusoidal basis functions. In particular embodiments, a Morlet basis function may be used to reconstruct the signal, according to particular needs. As described below, in particular embodiments, a wavelet power spectrum of a signal may be used to determine one or more characteristics of one or more anomalies in a wire.

In wavelet analysis of a signal, the signal may be analyzed across multiple time scales, which may provide multiresolution capability. In particular embodiments, a continuous wavelet transform may be applied, across multiple wavelet scales, to the signal using a Morlet or other basis function. A wavelet power spectrum may be calculated that accounts for the signal across all wavelet scales used in the analysis. A wavelet scale corresponds to frequency in FT analysis. At different wavelet scales, a signal may include various signal levels (which may be measured in volts or ohms). These signal levels across these wavelet scales constitute a wavelet power spectrum of the signal. To calculate a wavelet power spectrum of a signal, a wavelet transform of the signal may first be calculated using a Morlet or other suitable basis function. The wavelet coefficients of the signal may each be a function of wavelet scale. The wavelet coefficients may indicate a degree of similarity between the signal and basis function used to reconstruct the signal. As an example, in a plot of the wavelet transform, a brightness of one or more certain regions of the plot may indicate this similarity. A wavelet power spectrum of the signal may then be calculated and plotted using the wavelet coefficients of the wavelet transform. The wavelet power spectrum may be conceptually analogous to a Fourier power spectrum. In particular embodiments, the wavelet power spectrum may be plotted along an x axis that includes a range of wavelet scales and a y axis may include a range of averages of squared wavelet coefficients across all samples at a certain wavelet scale.

In particular embodiments, an anomaly in a wire may have a distinctive wavelet power spectrum that may be used to determine one or more characteristics of the anomaly. As an example, consider a first wavelet power spectrum corresponding to an anomaly in a wire. The first wavelet power spectrum may be compared with one or more second wavelet power spectra from a library of wavelet power spectra that correspond to known anomalies having known characteristics. This library may be developed through empirical studies of various anomalies in various wires. Analysis data 20 may contain this library. If the first wavelet power spectrum corresponds to one or more second wavelet power spectra corresponding to one or more particular known anomalies having one or more particular known characteristics, it may be concluded that the anomaly in the wire has the one or particular known characteristics of the one or more particular known anomalies.

Any suitable aspects of the wavelet power spectrum may be used to determine whether the first wavelet power spectrum corresponds to one or more second wavelet power spectra. As an example, a location of a peak in a plot of the wavelet power spectrum with respect to an x axis, a y axis, or both may be used to make this determination. In particular embodiments, one or more suitable statistical analysis techniques may be used to determine whether the first power spectrum corresponds to one or more second power spectra. One or more such techniques may estimate a probability that a peak from a wavelet power spectrum is significant with respect to a background spectrum. In addition or as an alternative, a parameter estimation statistical analysis technique may be used to determine whether the first power spectrum corresponds to one or more second power spectra.

Figure 2:
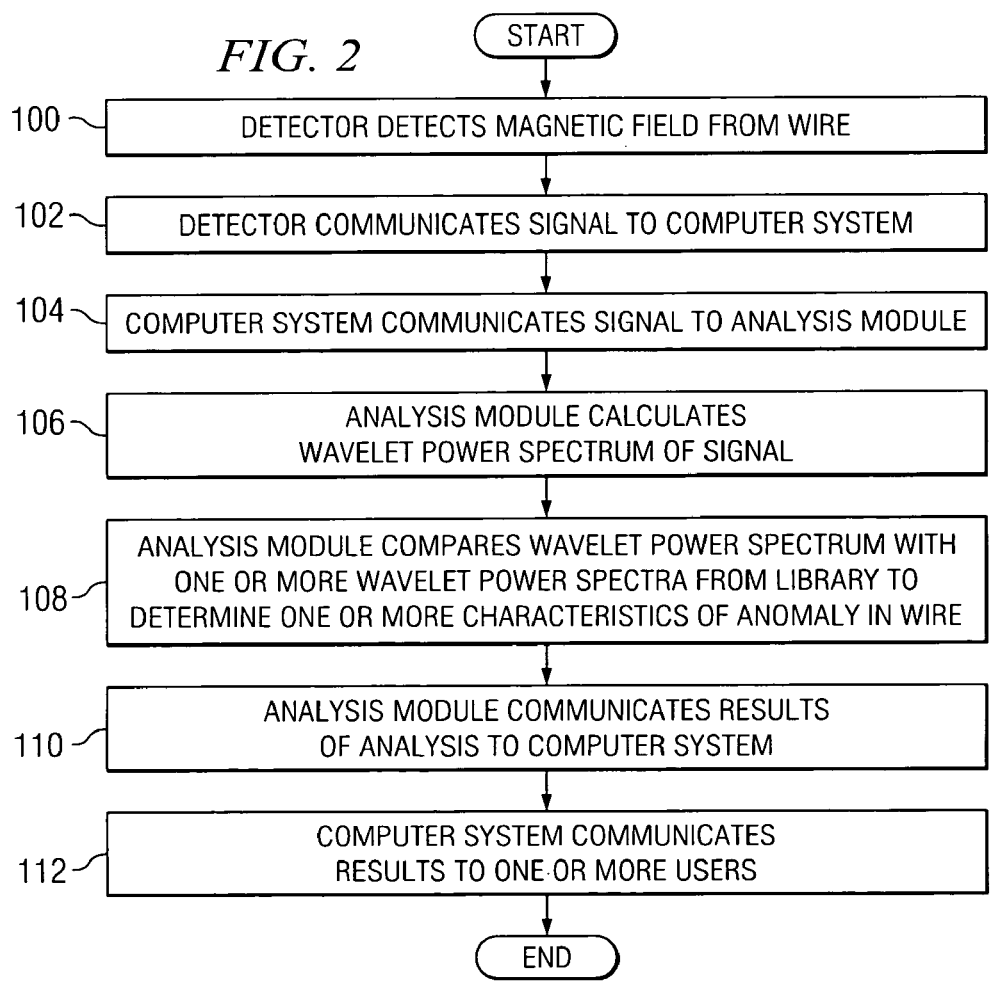
FIG. 2 illustrates an example method for wavelet analysis of one or more signals to determine one or more characteristics of one or more anomalies in a wire.

FIG. 2 illustrates an example method for wavelet analysis of one or more signals to determine one or more characteristics of one or more anomalies in a wire. The method begins at step 100, where detector 14 detects a magnetic field from a wire. At step 102, detector 14 communicates a signal to computer system 16 corresponding to a signal that generated the magnetic field. As described above, a TDR signal may be used to generate the magnetic field. At step 104, computer system 16 communicates the signal to analysis module 18 for analysis. At step 106, analysis module 18 calculates a wavelet power spectrum of the signal, as described above. At step 108, analysis module 18 compares the wavelet power spectrum of the signal with one or more wavelet power spectra from a library of wavelet power spectra to determine one or more characteristics of the anomaly in the wire. As described above, this library may be developed through empirical studies of various anomalies in various wires. Analysis data 20 may include the library of wavelet power spectra. In particular embodiments, wavelet power spectra in the library may each correspond to one or more known anomalies having one or more particular characteristics.

If the wavelet power spectrum of the TDR signal more or less matches a particular wavelet power spectrum in the library corresponding to a particular known anomaly having one or more particular known characteristics, it may be concluded that the anomaly in the wire has the one or more particular known characteristics. In particular embodiments, one or more wavelet power spectra in the library each include a combination (such as an average) of two or more wavelet power spectra corresponding to two or more anomalies having one or more known characteristics. In particular embodiments, one or more suitable statistical analysis techniques may be used to determine whether the wavelet power spectrum of the signal corresponds to one or more power spectra in the library. At step 110, analysis module 18 communicates results of the analysis to computer system 16. At step 112, computer system 16 communicates the results to one or more users, at which point the method ends.

Although the present invention has been described with several embodiments, myriad changes, variations, alterations, transformations, and modifications may be suggested to one skilled in the art, and it is intended that the present invention encompass such changes, variations, alterations, transformations, and modifications as fall within the scope of the appended claims. The present invention is not intended to be limited, in any way, by any statement in the specification that is not reflected in the claims.

What is claimed is:

1. A system for wavelet analysis of one or more signals to determine one or more characteristics of one or more anomalies in a wire, the system comprising:
   a library of one or more reference wavelet analysis results that each correspond to one or more known anomalies having one or more known characteristics; and
   an analysis module operable to:
      receive a first signal from a detector that has scanned a magnetic field from a wire comprising an anomaly, the first signal corresponding to a second signal used to generate the magnetic field;
      calculate a wavelet analysis result from a wavelet analysis of the first signal, the wavelet analysis result corresponding to the second signal;
      access the library;
      compare the wavelet analysis result with one or more reference wavelet analysis results;
      responsive to the wavelet analysis result corresponding to one or more particular reference wavelet analysis results, indicate that the anomaly in the wire has one or more particular known characteristics of one or more particular known anomalies corresponding to the one or more particular reference wavelet analysis results; and
      determine a location of the anomaly in the wire from the scanned magnetic field.

2. The system of claim 1, wherein the wavelet analysis result comprises a wavelet power spectrum of the first signal and the reference wavelet analysis results each comprise one or more reference wavelet power spectra.

3. The system of claim 2, wherein a wavelet transform is used to calculate the wavelet power spectrum of the TDR signal.

4. The system of claim 1, wherein the second signal is a time domain reflectometry (TDR) signal.

5. The system of claim 1, wherein an integrated circuit (IC) package comprises the wire.

6. A method for wavelet analysis of one or more signals to determine one or more characteristics of one or more anomalies in a wire, the method comprising:
   receiving a first signal from a detector that has scanned a magnetic field from a wire comprising an anomaly, the first signal corresponding to a second signal used to generate the magnetic field;
   calculating a wavelet analysis result from a wavelet analysis of the first signal, the wavelet analysis result corresponding to the second signal;
   accessing a library of one or more reference wavelet analysis results that each correspond to one or more known anomalies having one or more known characteristics;
   comparing the wavelet analysis result with one or more reference wavelet analysis results; and
   responsive to the wavelet analysis result corresponding to one or more particular reference wavelet analysis results, indicating that the anomaly in the wire has one or more particular known characteristics of one or more particular known anomalies corresponding to the one or more particular reference wavelet analysis results; and
   determining a location of the anomaly from the scanned magnetic field.

7. The method of claim 6, wherein the wavelet analysis result comprises a wavelet power spectrum of the first signal and the reference wavelet analysis results each comprise one or more reference wavelet power spectra.

8. The method of claim 7, wherein a wavelet transform is used to calculate the wavelet power spectrum of the TDR signal.

9. The method of claim 6, wherein the second signal is a time domain reflectometry (TDR) signal.

10. The method of claim 6, wherein an integrated circuit (IC) package comprises the wire.

11. A system for wavelet analysis of one or more signals to determine one or more characteristics of one or more anomalies in a wire, the system comprising:
    means for receiving a first signal from a detector that has scanned a magnetic field from a wire comprising an anomaly, the first signal corresponding to a second signal used to generate the magnetic field;
    means for calculating a wavelet analysis result from a wavelet analysis of the first signal, the wavelet analysis result corresponding to the second signal;
    means for accessing a library of one or more reference wavelet analysis results that each correspond to one or more known anomalies having one or more known characteristics;
    means for comparing the wavelet analysis result with one or more reference wavelet analysis results;

means for indicating that the anomaly in the wire has one or more particular known characteristics of one or more particular known anomalies corresponding to the one or more particular reference wavelet analysis results; and means for determining a location of the anomaly from the scanned magnetic field.

12. The system of claim 1, wherein the one or more reference wavelet analysis results comprise one or more reference wavelet power spectra that each correspond to one or more known anomalies having one or more known characteristics;

wherein the second signal is a time domain reflectometry (TDR) signal;

wherein the analysis module is operable to calculate a wavelet analysis result from a wavelet power spectrum of the first signal;

wherein the analysis module is operable to compare the wavelet analysis result by comparing the wavelet power spectrum with one or more reference wavelet power spectra;

and wherein the analysis module is operable to indicate that the anomaly in the wire has one or more particular known characteristics of one or more particular known anomalies corresponding to the one or more particular reference wavelet power spectra, responsive to the wavelet power spectrum corresponding to one or more particular reference wavelet power spectra.

13. The system of claim 1, wherein the analysis module is further operable to:

indicate that the anomaly in the wire lacks one or more known characteristics of one or more known anomalies corresponding to one or more reference wavelet analysis results in the library, responsive to the wavelet analysis result not corresponding to one or more reference wavelet analysis results.

14. The method of claim 6, further comprising:

indicating that the anomaly in the wire lacks one or more known characteristics of one or more known anomalies corresponding to one or more reference wavelet analysis results in the library, responsive to the wavelet analysis result not corresponding to one or more reference wavelet analysis results.

15. The system of claim 11, further comprising:

means for indicating that the anomaly in the wire lacks one or more known characteristics of one or more known anomalies corresponding to one or more reference wavelet analysis results in the library, responsive to the wavelet analysis result not corresponding to one or more reference wavelet analysis results.

* * * * *